United States Patent
Hanking

(10) Patent No.: US 10,120,034 B2
(45) Date of Patent: Nov. 6, 2018

(54) BATTERY STRING MONITORING SYSTEM

(71) Applicant: Canara, Inc., San Rafael, CA (US)

(72) Inventor: Brian J. Hanking, Ellijay, GA (US)

(73) Assignee: Canara, Inc., San Rafael, CA (US)

( * ) Notice: Subject to any disclaimer, the term of this patent is extended or adjusted under 35 U.S.C. 154(b) by 108 days.

(21) Appl. No.: 15/284,324

(22) Filed: Oct. 3, 2016

(65) Prior Publication Data

US 2017/0102435 A1   Apr. 13, 2017

Related U.S. Application Data

(60) Provisional application No. 62/238,223, filed on Oct. 7, 2015.

(51) Int. Cl.
*G01R 31/36* (2006.01)
*H01M 10/48* (2006.01)
*H01M 10/42* (2006.01)

(52) U.S. Cl.
CPC ..... *G01R 31/3658* (2013.01); *G01R 31/3679* (2013.01); *H01M 10/4207* (2013.01); *H01M 10/482* (2013.01)

(58) Field of Classification Search
CPC ........... G01R 31/3658; G01R 31/3679; H01M 10/4207; H01M 10/482
USPC ........................................ 324/434, 426, 425
See application file for complete search history.

(56) References Cited

U.S. PATENT DOCUMENTS

| | | |
|---|---|---|
| 4,697,134 A | 9/1987 | Burkum et al. |
| 4,968,942 A | 11/1990 | Palanisamy |
| 5,047,722 A | 9/1991 | Wurst et al. |
| 5,140,269 A | 8/1992 | Champlin |
| 5,250,904 A | 10/1993 | Salander et al. |
| 5,281,920 A | 1/1994 | Wurst |
| 5,321,627 A | 6/1994 | Reher |
| 5,349,282 A | 9/1994 | McClure |
| 5,469,043 A | 11/1995 | Cherng et al. |
| 5,546,003 A | 8/1996 | Noworolski et al. |
| 5,572,136 A | 11/1996 | Champlin |
| 5,574,355 A | 11/1996 | McShane et al. |
| 5,583,416 A | 12/1996 | Klang |
| 5,589,757 A | 12/1996 | Klang |
| 5,592,093 A | 1/1997 | Klingbiel |

(Continued)

OTHER PUBLICATIONS

Alber Battery Monitoring Products Brochure, Albercorp, known at least as early as Jan. 1, 2011, 8 pages.

(Continued)

*Primary Examiner* — Giovanni Astacio-Oquendo
(74) *Attorney, Agent, or Firm* — Polsinelli PC

(57) ABSTRACT

Aspects of the present disclosure involve a monitoring system for a plurality of batteries connected in series. In one example, the monitoring system includes a monitoring circuit to be coupled across each of a plurality of distinct contiguous subsets of the batteries as a unit. The monitoring circuit includes at least one test signal generation circuit to generate a test signal and apply the test signal to each subset of the batteries, and at least one response measurement circuit to measure a response of each subset of the batteries to the test signal. The monitoring system also includes a control circuit to identify at least one of the subsets of the batteries as including a failing battery based on the measured response of each subset of the batteries.

13 Claims, 10 Drawing Sheets

(56) References Cited

U.S. PATENT DOCUMENTS

| | | |
|---|---|---|
| 5,596,262 A | 1/1997 | Boll |
| 5,656,920 A | 8/1997 | Cherng et al. |
| 5,661,463 A | 8/1997 | Letchak et al. |
| 5,698,967 A | 12/1997 | Baer et al. |
| 5,705,929 A | 1/1998 | Caravello et al. |
| 5,710,503 A | 1/1998 | Sideris et al. |
| 5,757,192 A | 5/1998 | McShane et al. |
| 5,811,975 A | 9/1998 | Bernardo |
| 5,821,756 A | 10/1998 | McShane et al. |
| 5,831,435 A | 11/1998 | Troy |
| 5,850,351 A | 12/1998 | Lofty et al. |
| 5,862,515 A | 1/1999 | Kobayashi et al. |
| 5,871,858 A | 2/1999 | Thomsen et al. |
| 5,900,734 A | 5/1999 | Munson |
| 5,914,605 A | 6/1999 | Bertness |
| 5,945,829 A | 8/1999 | Bertness |
| 5,969,625 A | 10/1999 | Russo |
| 6,031,354 A | 2/2000 | Wiley et al. |
| 6,037,751 A | 3/2000 | Klang |
| 6,037,777 A | 3/2000 | Champlin |
| 6,051,976 A | 4/2000 | Bertness |
| 6,069,412 A | 5/2000 | Raddi et al. |
| 6,081,098 A | 6/2000 | Bertness et al. |
| 6,094,030 A | 7/2000 | Gunthorpe et al. |
| 6,104,967 A | 8/2000 | Hagen et al. |
| 6,121,756 A | 9/2000 | Johnson et al. |
| 6,160,722 A | 12/2000 | Thommes et al. |
| 6,163,156 A | 12/2000 | Bertness |
| 6,172,505 B1 | 1/2001 | Bertness |
| 6,174,617 B1 | 1/2001 | Hiratsuka et al. |
| 6,201,720 B1 | 3/2001 | Tracy et al. |
| 6,218,744 B1 | 4/2001 | Zahrte et al. |
| 6,219,246 B1 | 4/2001 | Edevold et al. |
| 6,225,808 B1 | 5/2001 | Varghese et al. |
| 6,249,124 B1 | 6/2001 | Bertness |
| 6,259,254 B1 | 7/2001 | Klang |
| 6,262,899 B1 | 7/2001 | Raddi et al. |
| 6,266,260 B1 | 7/2001 | Zahrte, Sr. et al. |
| 6,268,710 B1 | 7/2001 | Koga |
| 6,274,950 B1 | 8/2001 | Gottlieb et al. |
| 6,292,379 B1 | 9/2001 | Edevold et al. |
| 6,295,215 B1 | 9/2001 | Faria et al. |
| 6,295,216 B1 | 9/2001 | Faria et al. |
| 6,304,087 B1 | 10/2001 | Bertness |
| 6,307,763 B1 | 10/2001 | Chavez et al. |
| 6,308,087 B1 | 10/2001 | Aoshima |
| 6,310,783 B1 | 10/2001 | Winch et al. |
| 6,313,608 B1 | 11/2001 | Varghese et al. |
| 6,314,007 B2 | 11/2001 | Johnson, Jr. et al. |
| 6,316,914 B1 | 11/2001 | Bertness |
| 6,323,650 B1 | 11/2001 | Bertness et al. |
| 6,329,793 B1 | 12/2001 | Bertness et al. |
| 6,330,176 B1 | 12/2001 | Tharp et al. |
| 6,331,762 B1 | 12/2001 | Bertness |
| 6,332,113 B1 | 12/2001 | Bertness |
| 6,348,782 B1 | 2/2002 | Oughton et al. |
| 6,351,102 B1 | 2/2002 | Troy |
| 6,356,284 B1 | 3/2002 | Manduley et al. |
| 6,356,471 B1 | 3/2002 | Fang |
| 6,356,948 B1 | 3/2002 | Barnett et al. |
| 6,359,441 B1 | 3/2002 | Bertness |
| 6,363,303 B1 | 3/2002 | Bertness |
| 6,374,460 B1 | 4/2002 | Edevold et al. |
| 6,377,031 B1 | 4/2002 | Karuppana et al. |
| 6,384,608 B1 | 5/2002 | Namaky |
| 6,391,489 B1 | 5/2002 | Winch et al. |
| 6,396,170 B1 | 5/2002 | Laufenberg et al. |
| 6,400,586 B2 | 6/2002 | Raddi et al. |
| 6,411,098 B1 | 6/2002 | Laletin |
| 6,418,024 B2 | 7/2002 | Edevold et al. |
| 6,437,574 B1 | 8/2002 | Robinson et al. |
| 6,437,957 B1 | 8/2002 | Karuppana et al. |
| 6,441,585 B1 | 8/2002 | Bertness |
| 6,442,494 B1 | 8/2002 | Baalu et al. |
| 6,445,158 B1 | 9/2002 | Bertness et al. |
| 6,456,036 B1 | 9/2002 | Thandiwe |
| 6,456,045 B1 | 9/2002 | Troy et al. |
| 6,462,961 B1 | 10/2002 | Johnson et al. |
| 6,465,908 B1 | 10/2002 | Karuppana et al. |
| 6,466,025 B1 | 10/2002 | Klang |
| 6,469,511 B1 | 10/2002 | Vonderhaar et al. |
| 6,483,730 B2 | 11/2002 | Johnson |
| 6,486,399 B1 | 11/2002 | Armstrong et al. |
| 6,497,209 B1 | 12/2002 | Karuppana et al. |
| 6,507,196 B2 | 1/2003 | Thomsen et al. |
| 6,515,883 B2 | 2/2003 | Wade |
| 6,535,100 B2 | 3/2003 | Forss |
| 6,544,078 B2 | 4/2003 | Palmisano et al. |
| 6,549,440 B2 | 4/2003 | Tassitino et al. |
| 6,566,883 B1 | 5/2003 | Vonderhaar et al. |
| 6,586,941 B2 | 7/2003 | Bertness et al. |
| 6,597,150 B1 | 7/2003 | Bertness et al. |
| 6,599,657 B1 | 7/2003 | Pollett et al. |
| 6,605,879 B2 | 8/2003 | Wade et al. |
| 6,611,774 B1 | 8/2003 | Zaccaria |
| 6,623,314 B1 | 9/2003 | Cox et al. |
| 6,629,247 B1 | 9/2003 | Hall et al. |
| 6,633,165 B2 | 10/2003 | Bertness |
| 6,635,974 B1 | 10/2003 | Karuppana et al. |
| 6,654,355 B1 | 11/2003 | Marbach et al. |
| 6,661,678 B2 | 12/2003 | Raddi et al. |
| 6,677,759 B2 | 1/2004 | Friel et al. |
| 6,696,819 B2 | 2/2004 | Bertness |
| 6,724,596 B2 | 4/2004 | Wade |
| 6,744,149 B2 | 6/2004 | Karuppana et al. |
| 6,753,622 B2 | 6/2004 | Oughon |
| 6,759,849 B2 | 7/2004 | Bertness et al. |
| 6,768,309 B2 | 7/2004 | Liebermann et al. |
| 6,781,382 B2 | 8/2004 | Johnson |
| 6,788,025 B2 | 9/2004 | Bertness et al. |
| 6,795,782 B2 | 9/2004 | Bertness et al. |
| 6,805,090 B2 | 10/2004 | Bertness et al. |
| 6,819,576 B2 | 11/2004 | Johnson |
| 6,833,760 B1 | 12/2004 | Aude |
| 6,850,037 B2 | 2/2005 | Bertness |
| 6,864,665 B2 | 3/2005 | Yoshida |
| 6,871,151 B2 | 3/2005 | Bertness |
| 6,885,195 B2 | 4/2005 | Bertness |
| 6,885,307 B2 | 4/2005 | Lockhart et al. |
| 6,888,468 B2 | 5/2005 | Bertness |
| 6,891,378 B2 | 5/2005 | Bertness et al. |
| 6,897,724 B2 | 5/2005 | Gurvich et al. |
| 6,906,522 B2 | 6/2005 | Bertness et al. |
| 6,906,523 B2 | 6/2005 | Bertness et al. |
| 6,906,933 B2 | 6/2005 | Taimela |
| 6,913,483 B2 | 7/2005 | Restaino et al. |
| 6,914,412 B2 | 7/2005 | Wang et al. |
| 6,914,413 B2 | 7/2005 | Bertness et al. |
| 6,919,725 B2 | 7/2005 | Bertness et al. |
| 6,924,622 B1 | 8/2005 | Anbuky et al. |
| 6,930,485 B2 | 8/2005 | Bertness et al. |
| 6,941,234 B2 | 9/2005 | Bertness et al. |
| 6,967,484 B2 | 11/2005 | Bertness |
| 7,003,410 B2 | 2/2006 | Bertness et al. |
| 7,003,411 B2 | 2/2006 | Bertness |
| 7,012,433 B2 | 3/2006 | Smith et al. |
| 7,015,674 B2 | 3/2006 | VonderHaar |
| 7,039,533 B2 | 5/2006 | Bertness et al. |
| 7,058,525 B2 | 6/2006 | Bertness et al. |
| 7,081,755 B2 | 7/2006 | Kiang et al. |
| 7,106,070 B2 | 9/2006 | Bertness et al. |
| 7,116,109 B2 | 10/2006 | Klang |
| 7,129,822 B2 | 10/2006 | Finan et al. |
| 7,132,833 B2 | 11/2006 | Layden et al. |
| 7,184,905 B2 | 2/2007 | Stefan |
| 7,198,510 B2 | 4/2007 | Bertness |
| 7,199,557 B2 | 4/2007 | Anbuky et al. |
| 7,208,914 B2 | 4/2007 | Klang |
| 7,218,078 B2 | 5/2007 | Gagnon et al. |
| 7,394,394 B2 | 7/2008 | Lockhart et al. |
| 7,474,228 B2 | 1/2009 | Lockhart et al. |
| 7,479,763 B2 | 1/2009 | Bertness |
| 7,505,856 B2 | 3/2009 | Restaino et al. |
| 7,545,146 B2 | 6/2009 | Klang et al. |

(56) References Cited

U.S. PATENT DOCUMENTS

| | | |
|---|---|---|
| 7,557,586 B1 | 7/2009 | Vonderhaar et al. |
| 7,576,517 B1 | 8/2009 | Cotton et al. |
| 7,576,518 B2 | 8/2009 | Sanders et al. |
| 7,619,417 B2 | 11/2009 | Klang |
| 7,768,238 B2 | 8/2010 | Cotton et al. |
| 7,774,151 B2 | 8/2010 | Bertness |
| 7,940,052 B2 | 5/2011 | Vonderhaar et al. |
| 7,970,585 B2 | 6/2011 | Van Sloun et al. |
| 8,040,110 B2 | 10/2011 | Al-Anbuky et al. |
| 8,131,486 B2 | 3/2012 | Leonard et al. |
| 8,154,297 B2 | 4/2012 | Mousavi et al. |
| 9,537,332 B2 | 1/2017 | Cotton et al. |
| 2002/0171428 A1 | 11/2002 | Berntess |
| 2003/0057918 A1 | 3/2003 | Aoki et al. |
| 2003/0139888 A1 | 7/2003 | Burns |
| 2004/0006440 A1 | 1/2004 | Kim et al. |
| 2004/0027094 A1 | 2/2004 | Sanders et al. |
| 2004/0108856 A1 | 6/2004 | Johnson |
| 2004/0199343 A1 | 10/2004 | Cardinal et al. |
| 2005/0071093 A1 | 3/2005 | Stefan |
| 2006/0176630 A1 | 8/2006 | Carlino et al. |
| 2008/0239775 A1 | 10/2008 | Oughton et al. |
| 2009/0173582 A1 | 7/2009 | Ogg |
| 2009/0228225 A1 | 9/2009 | Burgess |
| 2010/0253147 A1 | 10/2010 | Ogg |
| 2011/0095603 A1* | 4/2011 | Lee .................. B60L 11/1803 307/10.1 |
| 2011/0316473 A1* | 12/2011 | Yen ...................... H02J 7/027 320/107 |
| 2013/0113429 A1 | 5/2013 | Kim et al. |
| 2013/0169236 A1 | 7/2013 | Schaefer et al. |
| 2014/0015488 A1 | 1/2014 | Despesse |
| 2015/0139272 A1 | 5/2015 | Hanking et al. |
| 2016/0294213 A1* | 10/2016 | Morrison .............. H02J 9/061 |
| 2017/0060150 A1* | 3/2017 | Stefanski ............ G05D 23/27 |
| 2018/0036740 A1* | 2/2018 | Nelson ................. B02C 19/18 |
| 2018/0059176 A1* | 3/2018 | Ding .................. G01R 1/0433 |

OTHER PUBLICATIONS

Automatic Battery Monitoring System (ABMS), L-3 Maritime Systems, located at http://www.l-3mps.com/maritimesystems/abms.asp, known at least as early as Dec. 1, 2010, 1 page.

BACS—Battery Analysis & Care System Data Sheet, Generex Systems Gmbh (date unknown) located at http://www.generex.de/generex/download/datasheets/Datasheet_BACS_C20_en.pdf, last visited on Oct. 19, 2015, 17 pages.

Battery Management System (BMS), International Battery, Inc., Allentown, PA, 2010, 1 page.

BDS/Pro Battery Monitoring Brochure, Eagle Eye Power Solutions, located at http://eepowersolutions.com/products/battery-monitoring/ipgms, known at least as early as Dec. 1, 2010, 5 pages.

BDS/Pro Installation Instructions, Eagle Eye Power Solutions, known at least as early as Jan. 1, 2011, 14 pages.

BDs-40 Battery Diagnostic System Brochure, Alber (date unknown) located at http://www.alber.com/BrochuresPDF/BDS40_Brochure_Final_Web.pdf, 2 pages, last visited on Oct. 19, 2015.

BDS-40 Monitor Product Description guide, Alber (date unknown) located at http://www.aber.com/Docs/4200_063PDG_BDS40,pdf, 26 pages, last visited on Oct. 19, 2015.

Brown, "Battery Power—Solutions for OEM Design Engineers, Integrators & Specifiers of Power Management Products," *Battery Power Magazine*, Sep./Oct. 2011, 2 pages.

BTM Global Battery Monitor Brochure, Polytronics Engineering Ltd., known at least as early as Jan. 1, 2011, 16 pages.

BTM Global Monitoring Controller Brochure, Polytronics Engineering Ltd., known at least as early as Jan. 1, 2011, 2 pages.

BTM Global System Controller User Manual, Polytronics Engineering Ltd., 2010, 16 pages.

CellGuard System Product Brochure, Midtronics, Willowbrook, IL, 2007, 4 pages.

CellQ Battery Monitoring Remote Access Controller Data Sheet, BTECH, Inc., Rockaway NJ, date unknown, 1 page.

CellSPY Monitoring System Architecture Brochure and Data Sheet, EMSYS Design, Inc., (date unknown) located at http://emsys-design.com/monitoringSystem.html, known at least as early as Dec. 6, 2013, 9 pages.

Cellwatch Battery Monitoring Systems Brochure, NDSL, Inc., known at least as early as Jan. 1, 2011, 8 pages.

EM1 Voltage, Temperature, and Impedance Module Data Sheet, BTECH, Inc., Rockaway NJ, date unknown, 1 page.

FirstLine BMS Product Brochure, Stayco Energy Products, Dayton, OH, 2011, 4 pages.

How Cellwatch Works, NDSL, located at http://www.cellwatch.com/about/how-cellwatch-works/, known at least as early as May 14, 2012.

LinkUPS Battery Test Remote Monitor Data Sheet, Ventev Innovations, known at least as early as Jan. 1, 2011, 2 pages.

PowerShield Configuration Software User Manual, PowerShield Limited, Auckland NZ, Oct. 2006, 68 pages.

PowerTrac SP Series Data Sheet, SBS Storage Battery Systems, Inc., known at least as early as Jan. 1, 2011, 2 pages.

S5 Battery Monitoring System BVM Battery Manager Software Data Sheet, BTECH, Inc., Rockaway NJ, Feb. 2009, 2 pages.

S5 Battery Monitoring System UPS/VRLA Battery Cabinet Data Sheet, BTECH, Inc., Rockaway NJ, Feb. 2009, 2 pages.

S-Box Data Sheet, LEM, (date unknown) located at http://www.lem.com/images/stories/files/Products/P1_7_5_sentinel/s_box.pdf, last visited on Oct. 19, 2015, 2 pages.

S-Bus Converter Data Sheet, LEM, (date unknown) located at http://www.lem.com/images/stories/files/Products/P1_7_5_sentinel/s_bus_converter.pdf, last visited on Oct. 19, 2015, 2 pages.

Sentinel Battery Management System Brochure, Encell Technology, Inc., known at least as early as Jan. 1, 2011, 4 pages.

Sentinel Battery Monitoring Product Brochure, PowerShield Limited (date unknown) located at http://www.pwrshield.com/files/resources/powershield-battery-monitoring.pdf, last visited on Oct. 19, 2015, 6 pages.

Sentinel Battery Monitoring Solution Data Sheet, LEM, (date unknown) located at http://www.lem.com/images/stories/files/Products/P1_7_5_sentinel/CH29103.pdf, last visited on Oct. 19, 2015, 2 pages.

Sentinel Intelligent Battery Transducer Data Sheet, LEM, known at least as early as Jan. 1, 2011, 3 pages.

SPM-200 Site Power Monitor Brochure, Newar, known at least as early as Jan. 1, 2011, 4 pages.

Two—Minute Guide to eNotify, Eaton Corporation, Jan. 20, 2006, 1 page.

\* cited by examiner

BATTERY STRING MONITORING SYSTEM

RELATED APPLICATIONS

This application is related to and claims priority under 35 U.S.C. § 119(e) from U.S. Patent Application No. 62/238,223, filed Oct. 7, 2015 entitled "BATTERY STRING MONITORING SYSTEM," the entire contents of which is incorporated herein by reference for all purposes.

TECHNICAL FIELD

Aspects of the present disclosure relate generally to electrical batteries and, more specifically, to a monitoring system for a battery string.

BACKGROUND

Electrical batteries play an indispensable role in commercial and industrial systems, such as, for example, as an alternate source of power in an uninterruptible power supply (UPS) system. In such systems, each individual battery, or "jar," may supply a relatively small voltage, with several such batteries arranged or connected in series as a battery "string" to supply an overall voltage approximately equal to the sum of the battery voltages that is useful for the electronic system being supported.

To ensure the batteries in such a system are functioning properly and perform as expected when the need arises, such a system oftentimes includes a separate monitoring circuit for each battery. Typically, each monitor periodically tests its corresponding battery in an attempt to identify any battery that may be failing so that such a battery may be replaced before overall system performance is adversely affected. While such per-battery testing can be effective in identifying poorly performing batteries, such individual monitoring circuits may be considered expensive in some industrial or commercial applications. As a result, many types of battery systems, such as those employed in various facets of the telecommunications, utilities, cable television, railroad, and oil and gas industries, remain unmonitored.

BRIEF DESCRIPTION OF THE DRAWINGS

Exemplary embodiments are illustrated in referenced figures of the drawings. It is intended that the embodiments and figures disclosed herein are to be considered illustrative rather than limiting. The use of the same reference numerals in different drawings indicates similar or identical items.

DETAILED DESCRIPTION

Figure 1:
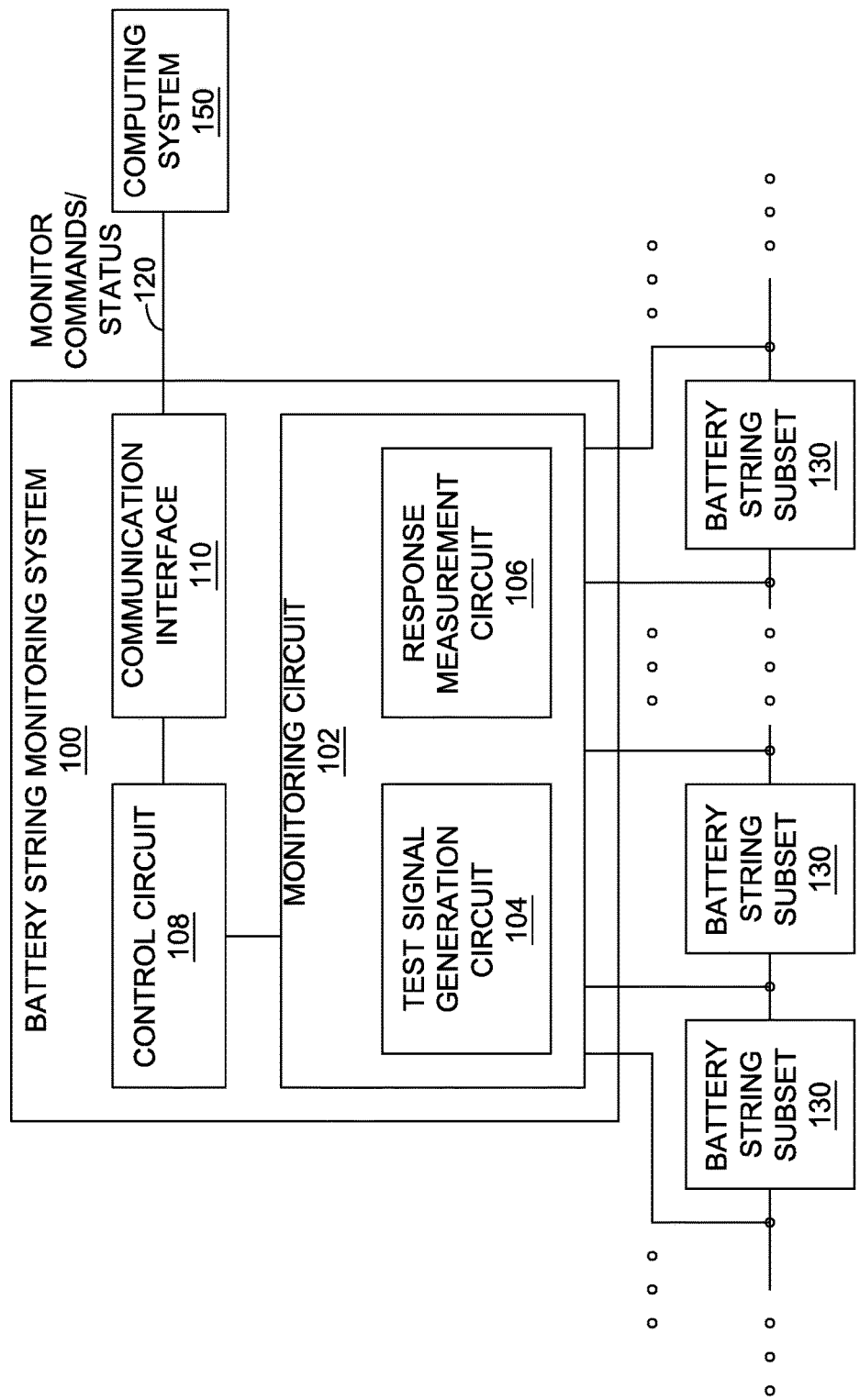
FIG. 1 is a block diagram of an example battery string monitoring system.

The disclosed battery monitoring system uses readings of voltages at multiple points on a battery string to determine the integrity of the battery string. Using these voltage readings, the system can determine if individual batteries are failing within the battery string. However, unlike individual battery monitors for each battery in the string, the disclosed system uses fewer voltage points than the number of batteries in the string. For example, if there are forty batteries on a battery string, battery monitoring using the disclosed system may only have four voltage monitoring points—each respective voltage value corresponding to voltage across a respective substring of ten batteries in the overall battery string. In another example, if a battery string contained five batteries, battery monitoring using the disclosed system may only use two voltage monitoring points—one corresponding to voltage across two of the batteries in the battery string, and another corresponding to voltage across the remaining three batteries in the battery string.

In other words, the battery monitoring system disclosed herein receives at least one voltage value which covers at least two batteries in series. As a minimum, the battery string should contain at least three batteries, with a first voltage reading covering a single battery and a second voltage reading covering the remaining two batteries. Preferably, the voltage readings cover symmetric substrings of batteries. For example, a battery string of forty batteries could record four measurements (one for every ten batteries), thereby dividing the string into quadrants. Dividing the battery string into quadrants reveals changes in the voltage measurements which are mirrored in the corresponding quadrants. By comparing the quadrant voltages, failing battery strings and/or individual failing batteries can be identified.

In a quadrant analysis, where the battery substring has been divided into four equal quadrants and voltages for each respective quadrant are analyzed by the monitoring system. For example, consider a battery string having a series of battery string subsets labeled A-B-C-D, which are located in that order. The voltage for quadrant A will mirror that of quadrant D (the "outer" voltages), and the voltage for quadrant B will mirror that of quadrant C (the "inner" voltages). By analyzing the voltages, their relative symmetry (or lack thereof), and overall behavior over time, determinations regarding the health and integrity of the batteries can be made.

In non-quadrant analyses with more or less voltage measurements, the mirroring principles of a quadrant analysis are likewise applicable inasmuch as symmetry exists between the respective substrings corresponding to the voltage measurements. When symmetry does not exist in the substrings, the system can compensate accordingly. In one example of compensating for a non-symmetric circumstance, a first voltage reading of a single battery can be provided to the monitoring system with a second voltage reading of a pair of batteries. The system, in analyzing the two voltages, can compensate for the difference in the respective substrings by (for example) doubling the voltage of the first voltage within the analysis, halving the voltage of the second voltage within the analysis, or otherwise adjusting the values being processed. In another example where compensation might be required for the analysis, the number of batteries between two substrings may be equal, but the types or qualities of the batteries may differ based on age, type, size, capability, etc.

In another non-quadrant analysis example, consider the circumstance where the number of voltage measurements is an odd number. The system can, inasmuch as is possible, seek to find at least one point of symmetry in the voltage measurements. Thus in an exemplary configuration where there are five voltage measurements, A-B-C-D-E, the C measurement can be a center measurement, with B & D forming an "inner" measurement having some degree of mirroring between the respective voltage readings, and A & E forming an "outer" measurement having some degree of mirroring between the respective voltage readings. The system, in analyzing the five measurements, can use the mirroring aspects of B & D and A & E, in conjunction with the voltage values of C, to make determinations regarding the health of the respective battery strings.

Having provided an overview of the general concepts disclosed herein, the disclosure now turns to the figures for additional details. FIG. 1 is a block diagram of an example battery string monitoring system 100. The battery string monitoring system 100 is capable of testing or measuring groups or subsets 130 of batteries, in addition to individual batteries, of a battery string. The battery string includes multiple batteries that are connected in series to generate a voltage for an electrical or electronic system. As illustrated in FIG. 1, the battery string monitoring system 100 is coupled across each subset 130. Each subset 130 in this example includes two or more series-connected batteries. According to at least some embodiments, the number of batteries, as well as the nominal voltage of each battery, in each subset 130 of the battery string being monitored by the battery string monitoring system 100 is the same. However, other embodiments of the battery string monitoring system 100 may be applied to battery strings in which the nominal battery voltages, as well as the number of batteries in each subset 130, may vary from subset 130 to subset 130.

The battery string monitoring system 100 of FIG. 1 may include a monitoring circuit 102, a control circuit 108, and a communication interface 110. Additionally, the monitoring circuit 102 may include at least one test signal generation circuit 104 and at least one response measurement circuit 106. Further, the battery string monitoring system 100 may include additional active and/or passive components, such as one or more resistors, capacitors, inductors, transistors, signal receivers, signal transmitters, output components (e.g., one or more light-emitting diodes (LEDs), sound generation devices, and/or the like), microcontrollers, digital signal processors (DSPs) or other algorithmic processors, but such components are not explicitly depicted in FIG. 1 to simplify the following discussion.

The test signal generation circuit 104 may be configured to generate at least one test signal and apply that test signal to a battery string subset 130. The test signal may be, for example, a direct current (DC) or alternating current (AC) voltage or current impressed upon the battery string subset 130 for some period of time, such as, for example, some number of milliseconds. The response measurement circuit 106 may be configured to measure a response of the battery string subset 130, such as a voltage or a current, to the test signal and/or to normal operation conditions of the battery. Depending on the particular embodiment, the application of the test signal and/or the measurement of the response may occur, for example, while the battery string subset 130 is delivering power, while the battery string subset 130 is being charged, and/or while the battery string subset 130 is at least temporarily disconnected from a power source and/or a load.

The control circuit 108 may be configured to generate and provide control and/or timing signals to the monitoring circuit 102, such as signals to initiate the generation and application of test signals in the test signal generation circuit 104, and signals to retrieve the responses measured in the response measurement circuit 106. In some examples, one or more of the signals between the control circuit 108 and the monitoring circuit 102 may be carried by way of a particular communication connection, such as, for example, an RS-232 serial communication connection. Further, in some embodiments, the measured responses may be in the form of analog and/or digital signals provided by the monitoring circuit 102 to the control circuit 108. In some examples, the control circuit 108 may provide such signals according to some schedule maintained at the control circuit 108, while in other embodiments, the control circuit 108 may receive monitor commands 120 from a local and/or remote computing system 150 via the communication interface 110 to initiate the test signal generation and response measurement functions. In addition, the control circuit 108 may provide monitor status 120, such as the measured responses and/or other information based on the measured responses, such as an indication of a particular battery string subset 130 that includes a battery that may be failing, to the computing system 150. In some embodiments, the local and/or remote computing system 150 may be configured to determine whether a particular battery string subset 130 includes a failing battery based on the status information 120 being received from the control circuit 108 via the communication interface 110. In some examples, a local computing system 150 may be a computing system located at the same site at which the battery string and the battery string monitoring system 100 are located, while a remote computing system 150 may be a computing system located external to such a site.

The control circuit 108 may include analog and/or digital circuitry configured to perform the various operations above, and may also include a microcontroller, DSP, and/or other algorithmic processor that may execute instructions stored in a memory accessible via the control circuit 108 to perform the various operations of the control circuit 108 described herein.

The communication interface 110 may be configured to receive monitor commands 120 from, and/or transmit monitor status 120 to, the computing system 150 via a wired or wireless communication connection or network. Examples of such a communication network may include one or more of an Ethernet network, a Universal Serial Bus (USB) connection, a cable communication network, a Digital Subscriber Line (DSL) network, a cellular network, and the like.

In some examples, the battery string monitoring system 100 and/or the computing system 150 may include a measurement database in which measurements obtained by the response measurement circuit 106 may be stored over time. In an embodiment, the stored measurements may be analyzed at the computing system 150 and/or the monitoring system 100 to discover patterns over time that may indicate the presence or future appearance of a battery failure or problem.

Figure 2:
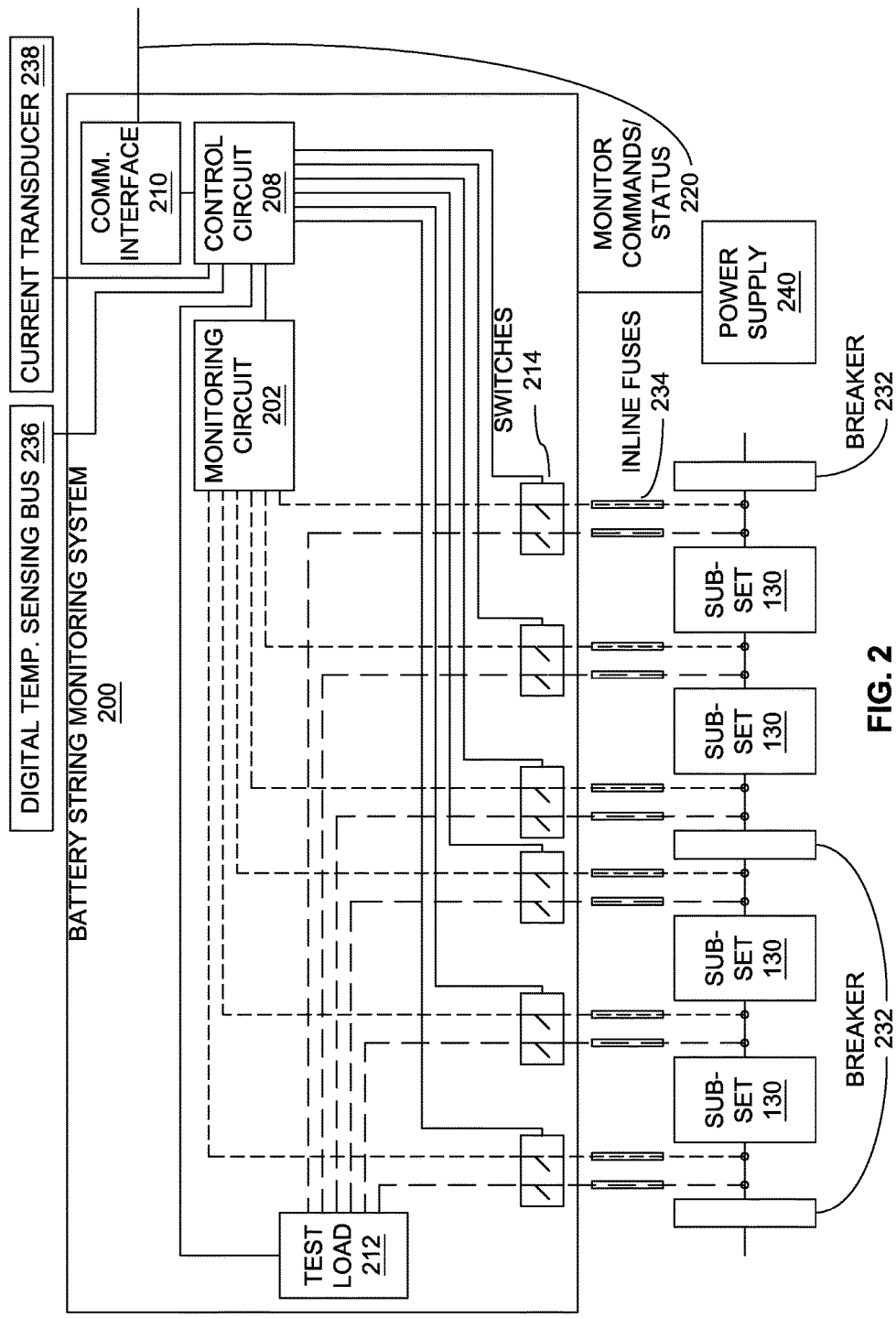
FIG. 2 is a block diagram of an example battery string monitoring system in which a single test load is applied across each of a plurality of subsets of the battery string in succession.

FIG. 2 is a block diagram of an example battery string monitoring system 200 in which a single test load 212 (or set of test loads) is applied across each of a plurality of subsets 130 of a battery string in succession to test the batteries of each subset 130. In one particular example, each subset 130 may include ten batteries of twelve volts (V) output voltage each, resulting in a voltage of 120 V for each subset 130. Also in this example, the battery string includes four total subsets 130, or quadrants, resulting in an overall string voltage of 480 V. However, in other examples, any number of subsets 130, any number of batteries per subset 130 (including a varying number of batteries from one subset 130 to another), and any level of output voltage per battery, may be employed in conjunction with the battery string monitoring system 200.

Also incorporated in the battery string may be one or more circuit breakers 232 placed at various locations between subsets 130 of the battery string, which may be configured to create an open circuit between subsets 130 upon detection of an overcurrent condition. While the breakers 232 of FIG. 2 are shown as being positioned at every two subsets 130 in the battery string, other locations for the breakers 232 are also possible.

As illustrated in FIG. 2, the battery string monitoring system 200 includes a monitoring circuit 202 that may serve as the monitoring circuit 102 of FIG. 1, a control circuit 208 that may serve as the control circuit 108 of FIG. 1, and a communication interface 210 that may serve as the communication interface 110 of FIG. 1. The battery string monitoring system 200 may also include a plurality of switches 214 in addition to the test load 212 noted above. The battery string monitoring system 200 may be powered by way of a power supply 240 separate from the battery string in at least some examples.

The monitoring circuit 202 may be configured to apply a generated test signal to a particular subset 130 of the battery string, and to measure the associated response of the subset 130, by way of a pair of connections associated with each subset 130 (depicted as shorter-dashed lines in FIG. 2).

The test load 212 may be any combination of electrical components (e.g., resistors, capacitors, inductors, transistors, and so on) to be applied across each of the subsets 130 according to a current configuration of the switches 214. In some embodiments, the test load 212 may provide a separate load designated for each subset 130 to be monitored, with each load being applied across a pair of connections (indicated by longer-dashed lines in FIG. 2). In other examples, the test load 212 may include more than one load circuit for each subset 130, each of which may be selectable by the control circuit 208 in turn.

Each of the switches 214 are depicted in FIG. 2 as a dual-pole, single-throw (DPST) switch that is electronically controlled by the control circuit 208. In one embodiment, one half of the switch 214 couples a connection of the test load 212 to an end of a subset 130 of the string, while the other half of the switch 214 couples a connection of the monitoring circuit 202 to that same end of the subset 130. Consequently, the control circuit 208, in one example, may be configured to close two adjacent switches 214 (as the switches 214 are depicted in FIG. 2) for some period of time so that the monitoring circuit 202 and the test load 212 are both coupled across one of the subsets 130 of the battery string. Once coupled in such a manner, the monitoring circuit 202 may apply a test signal to the coupled subset 130 (such as by way of a test signal generation circuit similar to the test signal generation circuit 104 of FIG. 1) and measure a response of the subset 130 to the test signal (such as by way of a response measurement circuit similar to the response measurement circuit 106 of FIG. 1) in conjunction with the test load 212.

The control circuit 208 may employ the monitoring circuit 202 and the test load 212 as described above to test or monitor each of the subsets 130, one at a time. Further, the control circuit 208 may initiate such monitoring in response to one or more commands 220 received via the communication interface 210 from a local or remote computing system, and provide measurements and related information as status 220 via the communication interface 210 in return.

The control circuit 208 may also be coupled with other sensors or transducers not directly connected with the subsets 130. For example, the control circuit 208 may communicate with a digital temperature sensing bus 236, in which multiple temperature sensors are coupled to a single communication bus to provide digital temperature information, such as ambient temperatures measured at multiple locations in the proximity of the battery string. The control circuit 208 may relay the received temperature information via the communication interface 210, and/or may employ the temperature information to interpret or process the measured responses from each of the battery subsets 130. The control circuit 208 may also communicate with a current transducer 238, such as a current transducer that, for example, senses an electrical current through the battery string and converts that current to a voltage, digital value, or some other indication to be forwarded to the control circuit 208. As with the temperature information, the control circuit 208 may forward that information via the communication interface 210 to a remote and/or local computing system.

Also depicted in FIG. 2, connecting each switch 214 to the subsets 130 of the battery string may be a pair of inline fuses 234. Each of the inline fuses 234 may be configured to create an open circuit between its corresponding subsets 130 and switch 214 in response to a higher-than-desired current, which may be caused, for example, by a short circuit in the battery string monitoring system 200, an overvoltage condition in a subset 130 of the battery string, or another fault, thus protecting the battery string and/or the battery string monitoring system 200 from current-related damage. Other examples of the battery string monitoring system 200 may not include the inline fuses 234.

Figure 3:
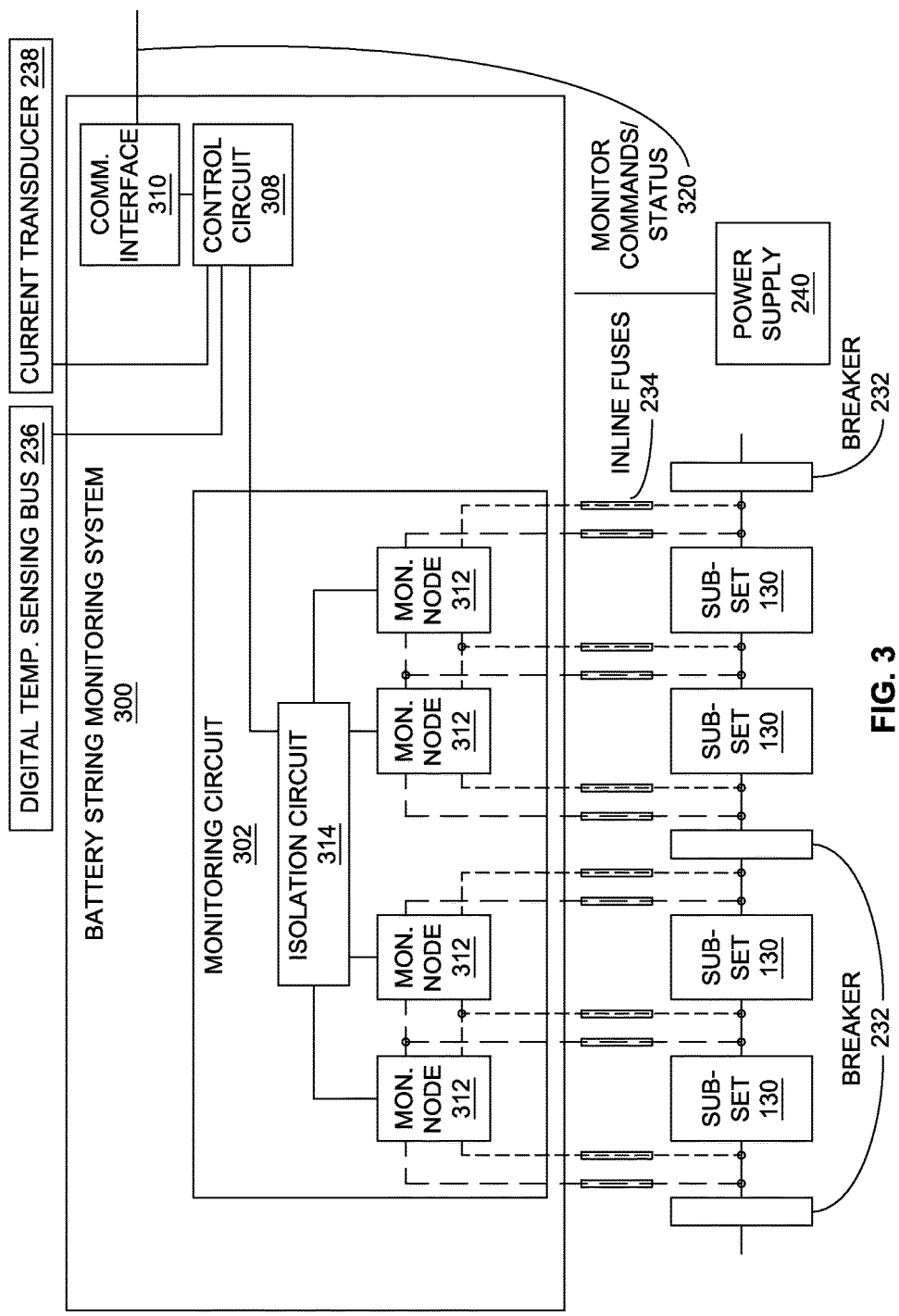
FIG. 3 is a block diagram of an example battery string monitoring system in which a separate monitor node is provided for each subset of the battery string to be monitored.

FIG. 3 is a block diagram of an example battery string monitoring system 300 in which a separate monitor node 312 is provided for each subset 130 of the battery string to be monitored. Components of the battery string monitoring system 300 and surrounding environment that are similar to those of the battery string monitoring system 200 of FIG. 2, such as the subsets 130 of the battery string, the circuit breakers 232, the inline fuses 234, the communication interface 310 and associated monitor commands and status 320, the digital temperature sensing bus 236, the current transducer 238, and the power supply 240, may perform the same or similar functions as those described above.

The monitoring circuit 302, which may serve as the monitoring circuit 102 of FIG. 1, may include a number of monitor nodes 312 equal to or greater than the number of subsets 130 of the battery string to be monitored. Each monitor node 312 may include a first pair of connections (depicted as the longer-dashed lines of FIG. 3) to a test load located internal to the monitor node 312, as well as a second pair of connections (illustrated by the shorter-dashed lines of FIG. 3) to a test signal generation circuit and/or a response measurement circuit (similar to the test signal generation circuit 104 and/or the response measurement circuit 106 of FIG. 1) located within the monitor node 312. An example of the monitor node 312 is discussed in greater detail below in conjunction with FIG. 4.

The control circuit 308 may control the operation of each monitor node 312, such as the initiation of the test signal generation and response measurement operations, through an isolation circuit 314. In some embodiments, the isolation circuit 314 may include one or more components that electrically isolate the control circuit 308 from each of the monitor nodes 312. In one particular example, the isolation circuit 314 may include one or more opto-isolators that couple the control circuit 308 with each of the monitor nodes 312 by way of an optical transmission path to provide the desired electrical isolation. In other examples, the control circuit 308 and the monitor nodes 312 may be electrically isolated from each other by way of transformers (to provide magnetic flux coupling) or capacitive couplers (to facilitate electric field coupling) without the use of a direct electrically conductive connection. Such isolation may be employed to allow the battery string monitoring system 300 to conform to one or more consumer safety standards, such as those provided by Underwriters Laboratories, the Canadian Standards Association, and the like. In other implementations, the isolation circuit 314 may include one or more digital and/or analog isolator circuits, DC-to-DC converters, and/or other components for coupling data, power, and/or other electrical signals or lines between a selected monitor node 312 and the control circuit 308.

Figure 4:
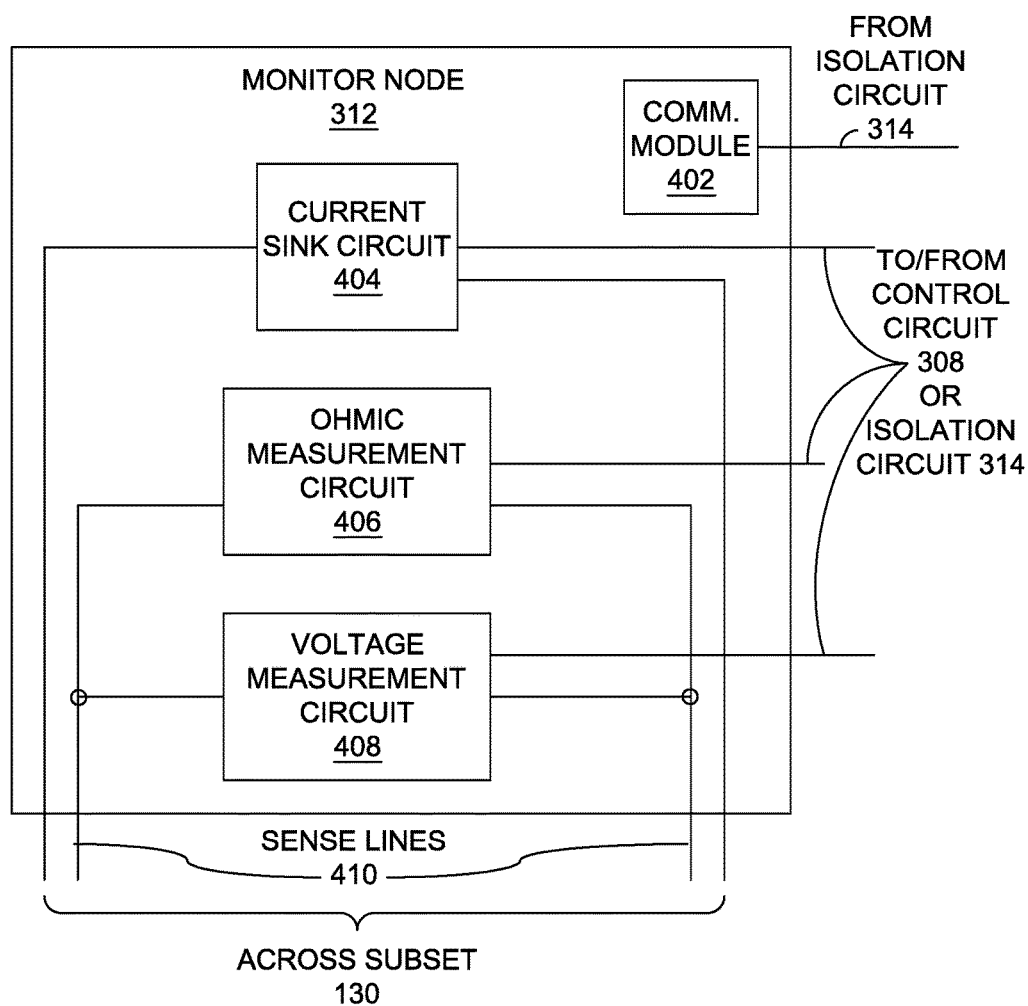
FIG. 4 is a block diagram of an example monitor node employable in the example battery string monitoring system of FIG. 3.

FIG. 4 is a block diagram of an example monitor node 312 employable in the example battery string monitoring system 300 of FIG. 3. In one example, the monitor node 312 may include a communication module 402, a current sink circuit 404, an ohmic measurement circuit 406, and a voltage measurement circuit 408. Other components or modules not explicitly illustrated in the monitor node 312 may be included in other embodiments. In some implementations, the monitor node 312 may be powered by way of a DC-to-DC converter within the isolation circuit 314 that provides isolation for the monitoring system 300 against large voltages (e.g., 1 kilovolt (kV) DC at the monitor node 312.

The communication module 402 may be a communication connection, such as, for example, an RS-232 serial communication connection to facilitate the receipt of commands from the control circuit 308 and/or the transmission of responses or status to the control circuit 308 via one or more digital isolators within the isolation circuit 314.

The current sink circuit 404 may be configured to sink a known amount of current from the battery string subset 130 to which the monitor node 312 is coupled, thus operating as a test load applied to the subset 130, and possibly as a test signal generation circuit (such as the test signal generation circuit 104 of FIG. 1) for measurement purposes. In one example, the current sink circuit 404 may include a metal-oxide-semiconductor field-effect transistor (MOSFET) controlled by a driving circuit to sink current from the subset 130 based on a voltage value from a digital-to-analog converter (DAC). The digital value provided to the DAC from which the voltage value is generated may be set by way of the control circuit 308 via the communication module 402. The current sink circuit 404 may further include an operational amplifier configured to measure the sink current across a sense resistor and to apply an appropriate voltage to the MOSFET via the driving circuit to yield a desired sink current. In one embodiment, the operational amplifier may be configured with a voltage gain (e.g., a gain of ten) so that the voltage across the sense resistor, and hence the resistance value of the resistor and the power dissipated by that resistor, may be reduced by that same gain factor. In some examples, the current sink circuit 404 may return an indication of the measured sink current as an analog or digital value to the control circuit 308.

In one embodiment, the current sink circuit 404 may sink current temporarily according to a sine wave with a DC offset, resulting in a current sink signal that varies from zero volts to a maximum peak-to-peak voltage, as determined via the DAC. In one example, the frequency of the current sink signal may be 1 kilohertz (kHz), although other frequencies may be utilized in other embodiments. The length of time that the current sink signal is active may be controlled via the control circuit 308.

In some examples, the current sink circuit 404 may include a second MOSFET connected in series with the first MOSFET to protect the system against a possible failure of the current sink circuit 404 due to overheating. More specifically, the second MOSFET may be large, and thus may be able to handle more current than the first MOSFET and thus dissipate heat generated by a large voltage and an associated large amount of power created when the current sink signal is active. To effect this safety feature, a temperature sensor may be mounted to the second MOSFET and configured to deactivate the driving circuit in response to the temperature sensed exceeding some predetermined threshold.

The ohmic measurement circuit 406 may be configured to measure an internal resistance of the battery string subset 130 to which the monitor node 312 is coupled when the current sink circuit 404 is actively sinking current from the subset 130. In one example, the ohmic measurement circuit 406 may measure a voltage drop across the subset 130 while the current sink circuit 404 is operating, the voltage drop representing the sink current multiplied by the internal resistance of the subset 130. In one embodiment, the ohmic measurement circuit 406 may include an AC-coupled differential amplifier connected across the subset 130. In this scenario, the differential amplifier may output a DC-offset sine wave corresponding to the sinusoidal current sinking signal produced by the current sink circuit 404, with the amplitude of that sine wave corresponding to the internal resistance of the subset 130 multiplied by the sink current. In some examples, the output of the differential amplifier may be filtered using a two-pole analog filter configured to pass a 3.2 kHz sine wave. The resulting filtered sine wave may then be provided to the control circuit 308 along with the current measurement from the current sink circuit 404 to determine the resulting subset 130 internal resistance (e.g., by dividing the measured voltage of the filtered sine wave by the current measurement provided by the current sink circuit 404). In some embodiments, the control circuit 308 may include one or more analog-to-digital converters (ADCs) (e.g., a 12-bit ADC rated for a maximum input voltage of 2.5 V) to convert the received analog signals for the voltage and current from the ohmic measurement circuit 406 and the current sink circuit 404, respectively.

In one embodiment, the ohmic measurement circuit 406 may also include an operational amplifier having a gain that may be programmed via the control circuit 308. In one example, the control circuit 308 may set the gain of the operational amplifier so that the amplitude of the filtered sine wave does not exceed the maximum input voltage of the ADC of the control circuit 308.

The voltage measurement circuit 408 may be configured to measure the voltage of the battery string subset 130 to which the monitor node 312 is coupled, such as during times when the current sink circuit 404 is not actively sinking current from the subset 130. In one example, the voltage measurement circuit 408 may include a resistor divider circuit configured to measure a known fraction of the voltage of the subset 130. Further, the voltage measurement circuit 408 may include an operational amplifier, such as a unity gain amplifier, serving as a buffer that receives the output of the resistor divider and provides an analog value indicating the voltage of the subset 130 to the control circuit 308. As indicated above, the control circuit 308 may include an ADC that converts the analog value into a digital value representing the subset 130 voltage. In some examples, the control circuit 308 may include a DSP that internally incorporates the one or more ADCs.

As shown in FIG. 4, the ohmic measurement circuit 406 and the voltage measurement circuit 408 may be connected across the subset 130 using sense lines 410 that are separate from the connection of the current sink circuit 404 to the subset 130, thus separating the connections for the test load and measurement functions of the monitor node 312 to the subset 130. In other examples, the current sink circuit 404, the ohmic measurement circuit 406, and the voltage measurement circuit 408 may be connected via a single pair or multiple pairs of connections across the subset 130.

Figure 5:
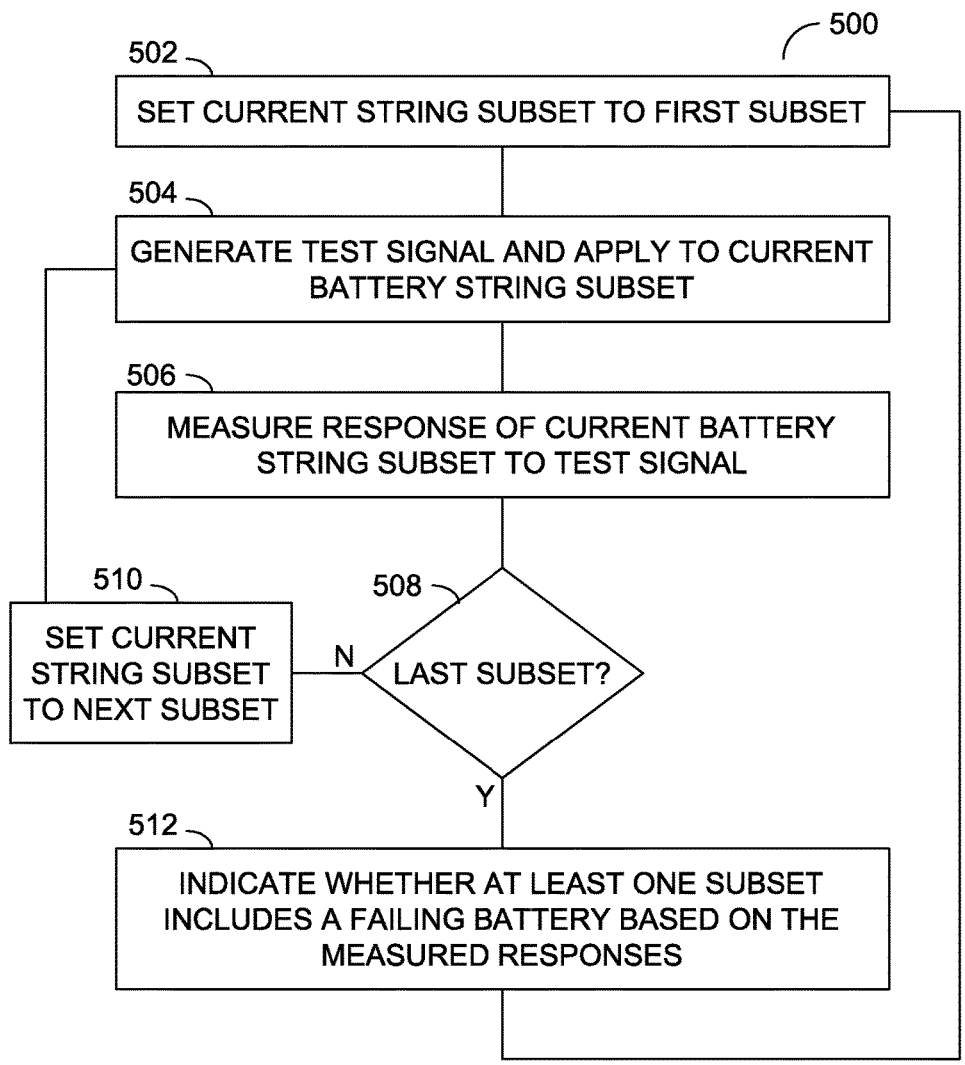
FIG. 5 is a flow diagram of an example method of monitoring a battery string by monitoring subsets of the battery string.

FIG. 5 is a flow diagram of an example method 500 of monitoring a battery string by monitoring subsets of the battery string. While the method 500 is described below as being performed by one of more of the various embodiments described herein (e.g., the battery string monitoring systems 100, 200, and 300 of FIGS. 1, 2, and 3, respectively), other systems not specifically described herein may perform the various operations of the method 500 in other embodiments.

In the method 500, a control circuit (e.g., the control circuit 108 of FIG. 1) may set an indication of a current battery string subset 130 to a first subset 130 of the subsets 130 (operation 502). A test signal generation circuit (e.g., the test signal generation circuit 104 of FIG. 1) may generate a test signal (e.g., a current sinking signal operating as a test load, as discussed above) and apply that signal to the current battery string subset 130 (operation 504). A response measurement circuit (e.g., the response measurement circuit 106 of FIG. 1) may measure the response of the current battery string subset to the test signal (operation 506). If the last subset 130 has not been processed (operation 508), the current string subset indication may be set to a next subset 130 (operation 510), and the test signal generation operation (operation 504) and the response measurement operation (operation 506) may be performed on the new current subset 130. If, instead, the last subset 130 has been monitored (operation 508), the control circuit or another portion of the battery string monitoring system may determine and/or indicate whether at least one subset 130 includes a failing battery based at least in part on the measured responses (operation 512). After the determination as to whether a subset 130 includes a failing battery, the control circuit may at some point thereafter begin monitoring each of the subsets 130 of the battery string once more (operation 502). In some examples, the control circuit may be responsible for initiating the test signal generation and response measurement operations in response to a command received from a local or remote computing system, as described above. Similarly, the control system may forward the measured responses to the local or remote computing system for processing to determine whether one or more subsets 130 may include a failing battery.

While the operations 502-512 are depicted as operations performed in a particular sequence, at least some of the operations 502-512 of FIG. 5 may be performed in other orders of execution, including in a parallel, overlapping, or concurrent manner. For example, the test signal generation operation (operation 504) and the response measurement operation (operation 506) may be performed on each of the subset 130 concurrently or simultaneously, if allowed by the architecture of the particular battery string monitoring system employed.

Figure 6:
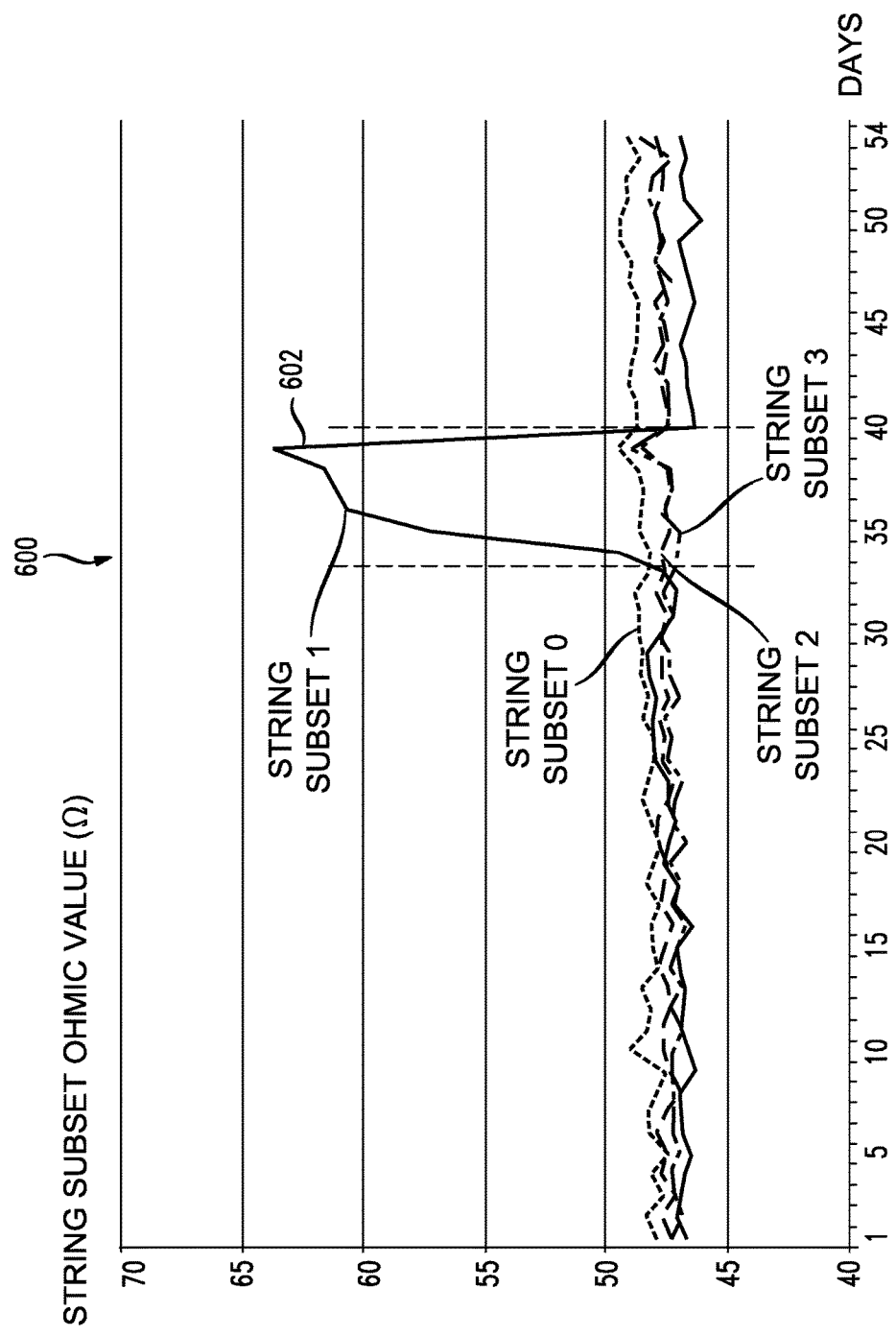
FIG. 6 is a graph of example battery string subset ohmic value measurements over time that may be employed to identify a subset that includes a failing battery.

FIG. 6 is a graph of example battery string subset ohmic (e.g., resistance) value measurements obtained over time that may be employed to identify a subset 130 that includes a failing battery. In this specific example, ohmic measurements taken over a number of days for each of four subsets 130 of a battery string, such as the subsets 130 of FIGS. 1, 2, and 3, are displayed according to their measured ohmic value in ohms ($\Omega$). The subsets 130 are labeled in FIG. 6 as String Subset 0, 1, 2, and 3. In some examples, a monitoring circuit (e.g., the monitoring circuit 102 of FIG. 1) may assert a test signal, such as current sink signal to the battery subset 130 and measure a response voltage across the subset 130, possibly by way of an active test load. Dividing the measured voltage across the subset 130 by the sink current may yield a measured ohmic value for the subset 130, as discussed earlier.

As shown in FIG. 6, while the ohmic value for each of the subsets 130 is measured to be between 45$\Omega$ and 50$\Omega$ from Day 1 through approximately Day 33, the ohmic value of String Subset 1 increases significantly beginning at approximately at Day 34 until Day 39, at which point the ohmic value of String Subset 1 is measured to be about 64$\Omega$, possibly indicating that at least one of the batteries of String Subset 1 is failing. The particular failing battery within String Subset 1 may be specifically identified thereafter, such as by a technician that personally tests or otherwise inspects the batteries of String Subset 1 based on the information of FIG. 6, and replaced, as shown at Day 40, thus returning String Subset 1 to a desired operational state. Alternatively, the particular failing battery within String Subset 1 may be specifically identified based on measurements initiated by the test signal generation circuit 104, where the measurements and subsequent analysis are specifically identified to determine which battery in the subset is failing.

Figure 7:
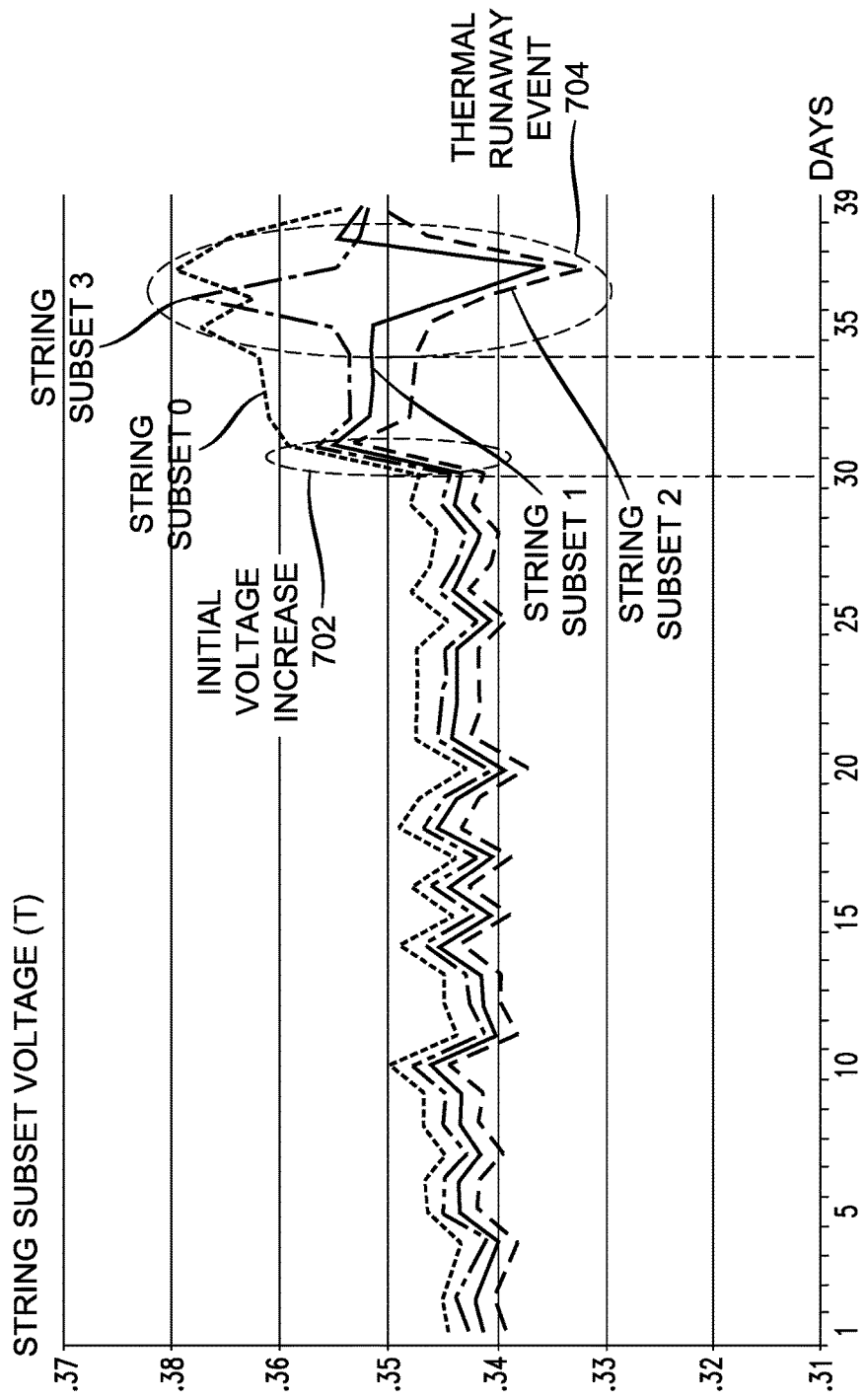
FIG. 7 is a graph of example battery string subset voltage measurements over time that may be employed to identify a subset that includes a battery exhibiting a thermal runaway event.

FIG. 7 is a graph of example battery string subset voltage measurements obtained over time that may be employed to identify a subset 130 that includes a battery exhibiting a thermal runaway event. A thermal runaway event, in at least some examples, may be characterized as a positive feedback condition in which changes in the operation of the battery, such as an internal short circuit that develops within the battery, excessive ambient temperatures applied to the battery, or some physical damage inflicted on the battery, causes an increase in temperature in the battery, causing a worsening of the condition, resulting in greater heat being generated, and so forth until the battery is rendered inoperative.

As illustrated in FIG. 7, the monitoring circuit may measure the string subset voltage (displayed in volts (V)) over a number of days. In some embodiments, this measurement may not involve a particular test signal to be asserted across the string 130, or involve connecting a particular test load across the subset 130. In other examples, the monitoring circuit may apply a particular test load of a known resistance while the voltage measurement across the subset 130 is taken. In this example, the string subset voltage for each of the subsets 130 measures as 34 to 35 V up through Day 30, at which point an initial voltage increase 702 may be seen based on the measured voltage across each of the subsets 130 increasing approximately 1 to 1.5 V over the course of a day or two. In at least some examples, the initial voltage increase 702 across all (or at least a plurality) of the string subsets 130 (e.g., String Subset 0, 1, 2, and 3) may be indicative of an impending thermal runaway event in a battery of at least one of the subsets 130.

After the initial voltage increase 702 a few days thereafter at about Day 35, the measured voltage across two of the subsets (e.g., Sting Subset 0 and String Subset 3) increase approximately 1 V or more while the voltage across the two remaining subsets 130 (e.g., String Subset 1 and String Subset 2) falls approximately 1.5 V. The falling voltages of String Subset 1 and String Subset 2 may be indicative of a thermal runaway event 704 in progress, while the rising voltages of String Subset 0 and String Subset 3 may be a response by those subsets 130 to compensate for the falling voltages of String Subset 1 and String Subset 2. Under this scenario, a technician may then replace one or more batteries within String Subset 1 and/or String Subset 2 based on a personal inspection of the batteries, which may include further testing or monitoring of the individual batteries in response to the measured voltages shown. In the particular example of FIG. 7, the battery replacements may occur at about Day 38, resulting in a relative normalization of the voltages for each of the subsets 130.

As shown in FIG. 7, the initial voltage increase 702 of the subsets 130 may provide an early indication to a technician or other personnel of the subsequent thermal runaway event 704. While in the case of FIG. 7, the initial voltage increase 702 precedes the thermal runaway event by approximately one week, other advanced warnings of two weeks or more may be possible. In addition, use of the battery string monitoring systems 100, 200, and 200 of FIGS. 1, 2, and 3, respectively, as described above, facilitate early warning and subsequent detection of a thermal runaway event by measuring voltages of the subsets 130, as opposed to employing direct temperature measurements of the batteries.

Figure 8:
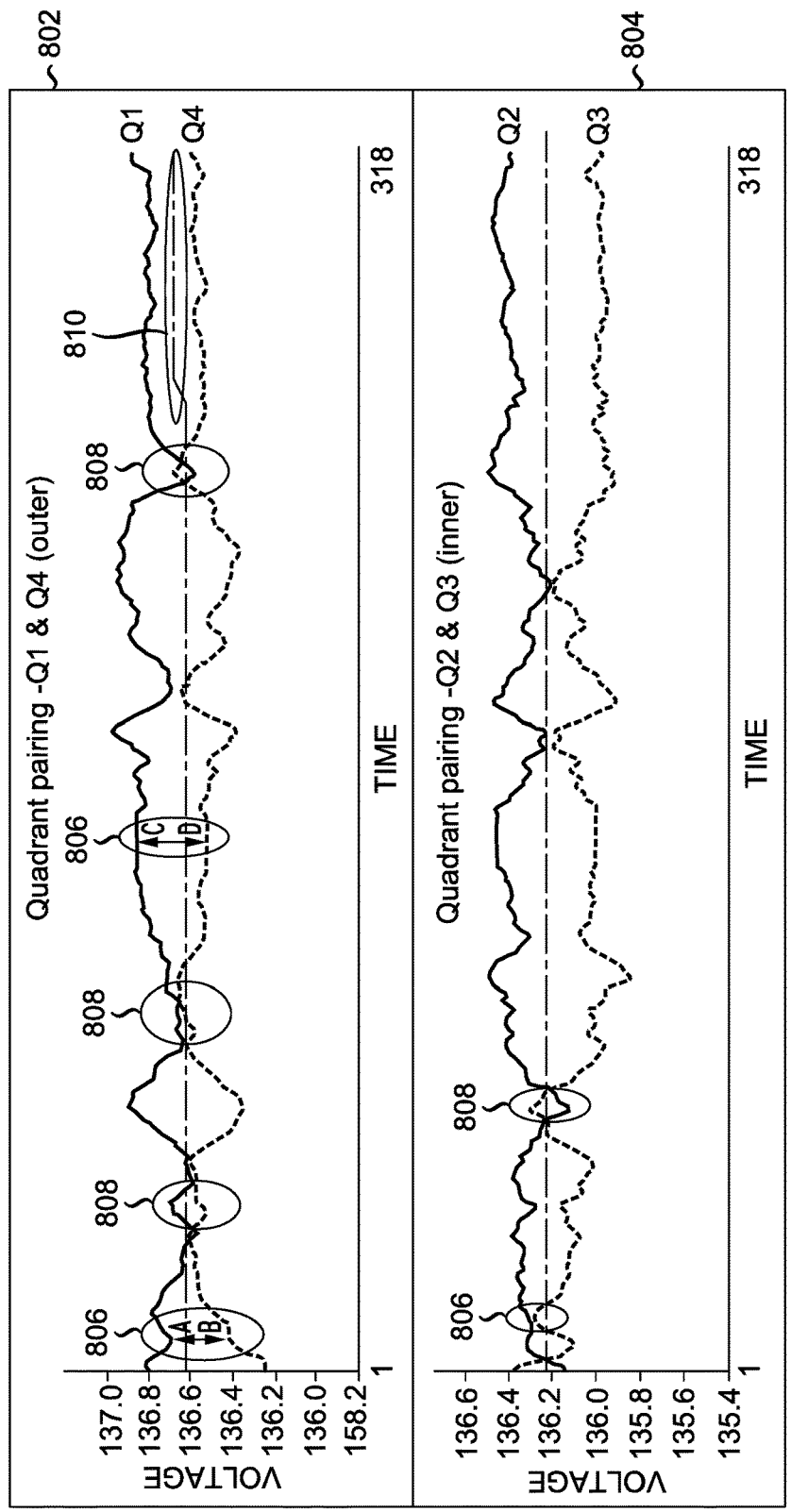
FIG. 8 illustrates two exemplary quadrant pairings of voltage measurements over time that may be employed to identify a subset that includes a failing battery.

FIG. 8 illustrates two exemplary quadrant pairings of voltage measurements over time that may be employed to identify a subset that includes a failing battery. The top pairing 802 shows voltage readings for Quadrant 1 (Q1) and Quadrant 4 (Q4) in a string of batteries, Q1 corresponding to a first substring and Q4 corresponding to a final substring where there are, in total, four substrings in the battery substring. Similarly, the bottom pairing 804 shows voltage readings for Quadrant 2 (Q2) and Quadrant 3 (Q3) in a string of batteries, Q2 corresponding to a second substring and Q3 corresponding to a third substring of the four substrings in the battery substring.

In this example, the voltage for each respective quadrant shifts over time, with the shifts being mirrored (for the most part) by the voltage reading for the paired quadrant. Thus as the voltage for Q1 goes up, the voltage for Q4 goes down, and vice versa. The mirroring takes place around a central voltage. In the case of Q2 & Q3, this central voltage remains constant throughout the entire time period being monitored. However, for Q1 & Q4, the central voltage moves 810 at over time. Movement in the central voltage between paired quadrants, such as the increase 810 in Q1 & Q4, and discrepancies in the mirroring between the respectively paired quadrants, can indicate errors in battery substrings and/or individual batteries.

For example, a processor receiving the voltage data for the respective quadrants may determine the points where voltages for the respective quadrants are not evenly distributed around the central voltage 86 indicate a failing substring and/or battery (see, for example, the difference "A" of Q1 from the central voltage compared to the difference "B" of Q4, or the later discrepancy between the differences "C" and "D"). Similarly, when the respective voltages for the quadrants "cross" one another or the central voltage 808 (such as when the quadrant which normally has a higher voltage has a lower voltage than its paired quadrant), or otherwise express statistically uncommon behavior, the processor can identify that an error is occurring. Identifying statistically uncommon behavior can occur through use of historical behavior to determine if an activity or voltage of one or more of the quadrants is outside of normal statistical thresholds defined by the historical data and/or a user. As the various voltages are received, the system can ensure that the voltages and behaviors of the various quadrants conform to the historical and/or defined behavior. When the battery strings are outside conformance, the system can automatically generate a ticket such that a technician can inspect (and possibly replace) one or more batteries within the string.

Figure 9:
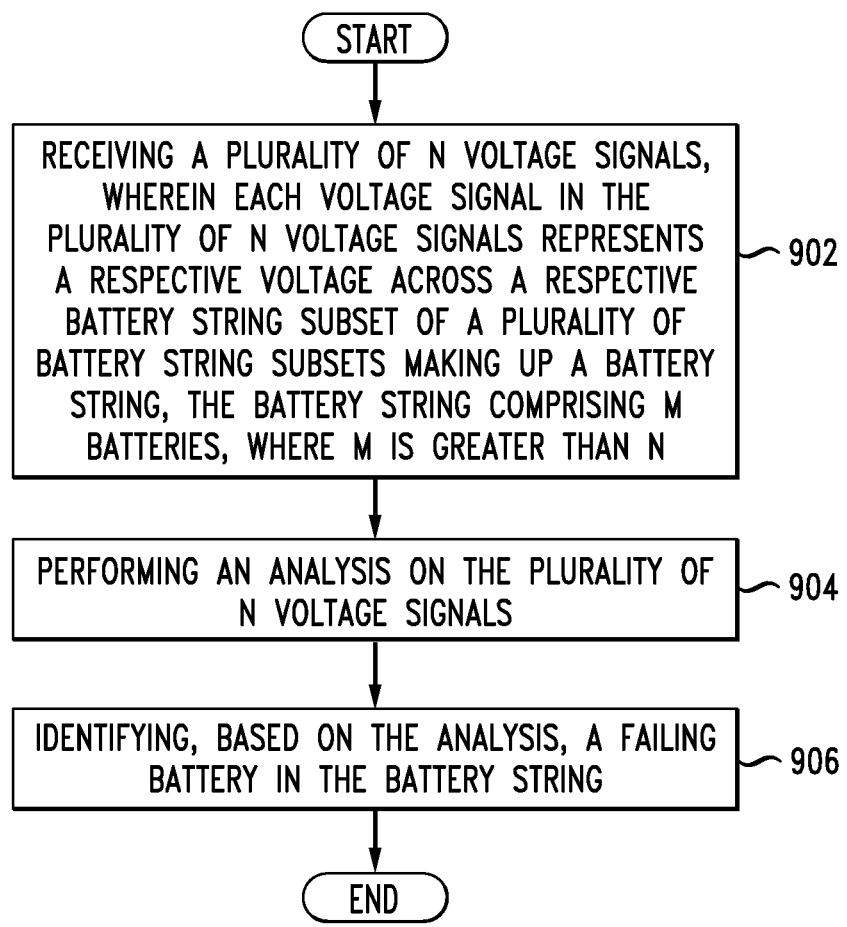
FIG. 9 illustrates an example method embodiment.

FIG. 9 illustrates an example method embodiment which can be performed by the computing system 150 illustrated in FIG. 1. The computing system 150 receives a plurality of N voltage signals, receiving, via a processor, a plurality of N voltage signals, wherein each voltage signal in the plurality of N voltage signals represents a respective voltage across a respective battery string subset of a plurality of battery string subsets making up a battery string, the battery string comprising M batteries, where M is greater than N (902). The computing system 150 then performs performing an analysis on the plurality of N voltage signals (904) and identifies, based on the analysis, a failing battery in the battery string (904).

The voltages received each correspond to distinct points in the battery string from the remaining voltage signals. In one configuration, the number of voltage signals received is four, with the overall battery string being divided into quadrants. During the analysis, each quadrant can be compared to the others, with the analysis identifying batteries and/or strings in need of additional testing based voltages, history, and/or on a mirroring effect between the quadrants. More specifically, the analysis can pair first and fourth quadrants on the string together, can pair the second and third quadrants together, and identify errors based on where a quadrant displays behavior not mirrored in its respective pair. The computing system 150 can also store the voltages received for the respective quadrants and develop determinations based on the historical data. Once the computing system 150 has identifying a failing battery (or a failing battery string), the system 150 can generate a notification for a user to inspect the battery. This notification can be emailed, displayed via a GUI, or otherwise communicated to the user.

Figure 10:
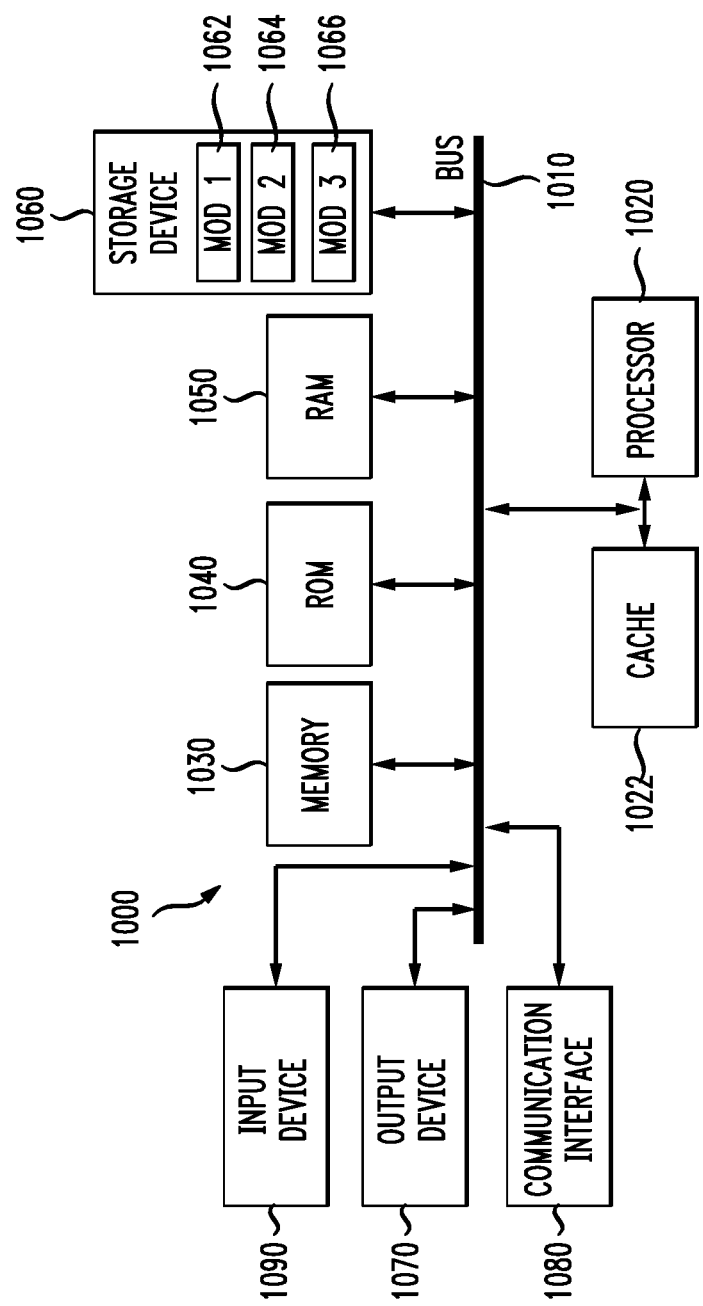
FIG. 10 illustrates an exemplary computer system which can be used to practice the methods and concepts disclosed herein.

FIG. 10 illustrates an exemplary computer system 150 which can be used to practice the methods and concepts disclosed herein. The exemplary system 1000 includes a processing unit (CPU or processor) 1010 and a system bus 1005 that couples various system components including the system memory 1015 such as read only memory (ROM) 1020 and random access memory (RAM) 1025 to the processor 1010. The system 1000 can include a cache 1012 of high speed memory connected directly with, in close proximity to, or integrated as part of the processor 1010. The system 1000 copies data from the memory 1015 and/or the storage device 1030 to the cache 1012 for quick access by the processor 1010. In this way, the cache 1012 provides a performance boost that avoids processor 1010 delays while waiting for data. These and other modules can control or be configured to control the processor 1010 to perform various actions. Other system memory 1015 may be available for use as well. The memory 1015 can include multiple different types of memory with different performance characteristics. It can be appreciated that the disclosure may operate on a computing device 1000 with more than one processor 1010 or on a group or cluster of computing devices networked together to provide greater processing capability. The processor 1010 can include any general purpose processor and a hardware module or software module, such as module 1 1032, module 2 1034, and module 3 1036 stored in storage device 1030, configured to control the processor 1010 as well as a special-purpose processor where software instructions are incorporated into the actual processor design. The processor 1010 may essentially be a completely self-contained computing system, containing multiple cores or processors, a bus, memory controller, cache, etc. A multi-core processor may be symmetric or asymmetric.

The system bus 1005 may be any of several types of bus structures including a memory bus or memory controller, a peripheral bus, and a local bus using any of a variety of bus architectures. A basic input/output (BIOS) stored in ROM 1020 or the like, may provide the basic routine that helps to transfer information between elements within the computing device 1000, such as during start-up. The computing device 1000 further includes storage devices 1030 such as a hard disk drive, a magnetic disk drive, an optical disk drive, tape drive or the like. The storage device 1030 can include software modules 1032, 1034, 1036 for controlling the processor 1010. Other hardware or software modules are contemplated. The storage device 1030 is connected to the system bus 1005 by a drive interface. The drives and the associated computer-readable storage media provide nonvolatile storage of computer-readable instructions, data structures, program modules and other data for the computing device 1000. In one aspect, a hardware module that performs a particular function includes the software component stored in a tangible computer-readable storage medium in connection with the necessary hardware components, such as the processor 1010, bus 1005, display 1035, and so forth, to carry out the function. In another aspect, the system can use a processor and computer-readable storage medium to store instructions which, when executed by the processor, cause the processor to perform a method or other specific actions. The basic components and appropriate variations are contemplated depending on the type of device, such as whether the device 1000 is a small, handheld computing device, a desktop computer, or a computer server.

Although the exemplary embodiment described herein employs the hard disk 1030, other types of computer-readable media which can store data that are accessible by a computer, such as magnetic cassettes, flash memory cards, digital versatile disks, cartridges, random access memories (RAMs) 1025, and read only memory (ROM) 1020, may also be used in the exemplary operating environment. Tangible computer-readable storage media, computer-readable storage devices, or computer-readable memory devices, expressly exclude media such as transitory waves, energy, carrier signals, electromagnetic waves, and signals per se.

To enable user interaction with the computing device 1000, an input device 1045 represents any number of input mechanisms, such as a microphone for speech, a touch-sensitive screen for gesture or graphical input, keyboard, mouse, motion input, speech and so forth. An output device 1035 can also be one or more of a number of output mechanisms known to those of skill in the art. In some instances, multimodal systems enable a user to provide multiple types of input to communicate with the computing device 1000. The communications interface 1040 generally governs and manages the user input and system output. There is no restriction on operating on any particular hardware arrangement and therefore the basic features here may easily be substituted for improved hardware or firmware arrangements as they are developed.

For clarity of explanation, the illustrative system embodiment is presented as including individual functional blocks including functional blocks labeled as a "processor" or processor 1010. The functions these blocks represent may be provided through the use of either shared or dedicated hardware, including, but not limited to, hardware capable of executing software and hardware, such as a processor 1010, that is purpose-built to operate as an equivalent to software executing on a general purpose processor. For example the functions of one or more processors presented in FIG. 10 may be provided by a single shared processor or multiple processors. (Use of the term "processor" should not be construed to refer exclusively to hardware capable of executing software.) Illustrative embodiments may include microprocessor and/or digital signal processor (DSP) hardware, read-only memory (ROM) 1020 for storing software performing the operations described below, and random access memory (RAM) 1025 for storing results. Very large scale integration (VLSI) hardware embodiments, as well as custom VLSI circuitry in combination with a general purpose DSP circuit, may also be provided.

The logical operations of the various embodiments are implemented as: (1) a sequence of computer implemented steps, operations, or procedures running on a programmable circuit within a general use computer, (2) a sequence of computer implemented steps, operations, or procedures running on a specific-use programmable circuit; and/or (3) interconnected machine modules or program engines within the programmable circuits. The system 1000 shown in FIG. 10 can practice all or part of the recited methods, can be a part of the recited systems, and/or can operate according to instructions in the recited tangible computer-readable storage media. Such logical operations can be implemented as modules configured to control the processor 1010 to perform particular functions according to the programming of the module. For example, FIG. 10 illustrates three modules Mod1 1032, Mod2 1034 and Mod3 1036 which are modules configured to control the processor 1010. These modules may be stored on the storage device 1030 and loaded into RAM 1025 or memory 1015 at runtime or may be stored in other computer-readable memory locations.

Embodiments within the scope of the present disclosure may also include tangible and/or non-transitory computer-readable storage media for carrying or having computer-executable instructions or data structures stored thereon. Such tangible computer-readable storage media can be any available media that can be accessed by a general purpose or special purpose computer, including the functional design of any special purpose processor as described above. By way of example, and not limitation, such tangible computer-readable media can include RAM, ROM, EEPROM, CD-ROM or other optical disk storage, magnetic disk storage or other magnetic storage devices, or any other medium which can be used to carry or store desired program code means in the form of computer-executable instructions, data structures, or processor chip design. When information is transferred or provided over a network or another communications connection (either hardwired, wireless, or combination thereof) to a computer, the computer properly views the connection as a computer-readable medium. Thus, any such connection is properly termed a computer-readable medium. Combinations of the above should also be included within the scope of the computer-readable media.

Computer-executable instructions include, for example, instructions and data which cause a general purpose computer, special purpose computer, or special purpose processing device to perform a certain function or group of functions. Computer-executable instructions also include program modules that are executed by computers in stand-alone or network environments. Generally, program modules include routines, programs, components, data structures, objects, and the functions inherent in the design of special-purpose processors, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Other embodiments of the disclosure may be practiced in network computing environments with many types of computer system configurations, including personal computers, hand-held devices, multi-processor systems, microprocessor-based or programmable consumer electronics, network PCs, minicomputers, mainframe computers, and the like. Embodiments may also be practiced in distributed computing environments where tasks are performed by local and remote processing devices that are linked (either by hard-wired links, wireless links, or by a combination thereof) through a communications network. In a distributed computing environment, program modules may be located in both local and remote memory storage devices.

In view of at least some of the embodiments described herein, effective and efficient monitoring of various characteristics of a battery string may be performed on multiple-battery subsets of the string, as opposed to individual batteries, thus reducing the overall hardware costs of monitoring, thereby rendering such embodiments applicable to many types of battery systems not currently being monitored due to cost considerations.

As used herein, the term "or" may be construed in either an inclusive or exclusive sense. Moreover, plural instances may be provided for resources, operations, or structures described herein as a single instance. Additionally, boundaries between various resources and operations may be arbitrary, and particular operations are illustrated in a context of specific illustrative configurations. In general, structures and functionality presented as separate resources in the example configurations may be implemented as a combined structure or resource. Similarly, structures and functionality presented as a single resource may be implemented as separate resources.

While the present disclosure has been described with reference to various embodiments, these embodiments are illustrative, and the scope of the disclosure is not limited to such embodiments. Various modifications and additions can be made to the exemplary embodiments discussed herein without departing from the scope of the disclosure. For example, while the embodiments described above refer to particular features, the scope of this disclosure also includes embodiments having different combinations of features, as well as embodiments that do not include all of the described features. Accordingly, the scope of the disclosure is intended to embrace all such alternatives, modifications, and variations, together with all equivalents thereof.

The invention claimed is:

1. A monitoring system, comprising:
a monitoring circuit electrically connected to each of a plurality of distinct contiguous subsets of a plurality of batteries connected in series, the monitoring circuit comprising:
at least one test signal generation circuit which generates a test signal and applies the test signal to each subset of the plurality of batteries; and
at least one response measurement circuit which measures a response of each subset of the plurality of batteries to the test signal; and
a control circuit identifying at least one of the subsets of the plurality of batteries as including a failing battery based on the response of each subset of the plurality of batteries.

2. The monitoring system of claim 1, the monitoring circuit further comprising:
a plurality of monitor nodes, each of the plurality of monitor nodes coupled across a separate one of the subsets of the plurality of batteries, each of the monitor nodes comprising:
one of the at least one test signal generation circuit to generate the test signal and apply the test signal to the subset of the plurality of batteries; and
one of the at least one response measurement circuit to measure the response of the subset of the plurality of batteries to the test signal.

3. The monitoring system of claim 1, further comprising:
a measurement database storing the response of each subset of the plurality of batteries over time, wherein the control circuit identifies at least one failing battery based on the responses stored in the measurement database.

4. The monitoring system of claim 1, wherein:
the response comprises a voltage of the subset of the plurality of batteries; and
the control circuit identifies an impending thermal runaway condition in at least one of the plurality of batteries in response to the voltage of the subset increasing over a first period of time.

5. The monitoring system of claim 4, wherein:
the response comprises a first measured voltage of a first subset of the plurality of batteries; and
the control circuit identifies the impending thermal runaway condition based on the measured voltage decreasing over a second period of time following the first period of time while a second measured voltage of a second subset of the plurality of batteries increases over the second period of time.

6. The monitoring system of claim 1, wherein:
the response comprises a measured voltage and a measured current for the subset of the plurality of batteries; and
the control circuit determines an ohmic value for each subset of the plurality of batteries based on the measured voltage and the measured current for each subset of the plurality of batteries, and identifies each subset of the plurality of batteries having a rising ohmic value as having the failing battery.

7. A method comprising:
receiving, via a processor, a plurality of N voltage signals, wherein each voltage signal in the plurality of N voltage signals represents a respective voltage across a respective battery string subset of a plurality of battery string subsets making up a battery string, the battery string comprising M batteries, where M is greater than N;

performing, via the processor, an analysis on the plurality of N voltage signals:

identifying, based on the analysis, one of a failing battery in the battery string and a failing battery string subset; and generating a notification for a user to inspect the one of a failing battery in the battery string and a failing battery string subset.

8. A battery monitoring system, comprising:

a processor;

a test signal generator;

a signal response receiver; and a plurality of battery connections, wherein:

each battery connection in the plurality of battery connections is connected to a respective subset in a battery string;

the test signal generator generates a test signal and applies the test signal to each of the respective subsets via the plurality of battery connections;

the signal response receiver receives a response from each of the respective subsets in response to the test signal, to yield a plurality of responses; and the processor identifies an error in the battery string based on the plurality of responses.

9. The battery monitoring system of claim 8, wherein the plurality of battery connections comprises at least four.

10. The battery monitoring system of claim 8, wherein at least one subset in the battery string having a battery connection has at least two batteries connected in series.

11. The battery monitoring system of claim 8, wherein the processor identifies the error based on mirroring in the plurality of responses.

12. The battery monitoring system of claim 8, wherein the plurality of responses comprise voltage responses and current responses.

13. The battery monitoring system of claim 8, wherein the processor generates an error report for a user describing the error.

* * * * *